(12) United States Patent
Saito et al.

(10) Patent No.: US 6,366,026 B1
(45) Date of Patent: Apr. 2, 2002

(54) ELECTROLUMINESCENCE DISPLAY APPARATUS

(75) Inventors: Yoshinori Saito, Konan; Ryoichi Yokoyama, Ohgaki, both of (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/518,484

(22) Filed: Mar. 3, 2000

(30) Foreign Application Priority Data

Mar. 5, 1999 (JP) .......................................... 11-058741

(51) Int. Cl.[7] ............................. G09G 3/10; G09G 3/28
(52) U.S. Cl. ................................ 315/169.3; 315/169.1; 345/76; 345/92
(58) Field of Search ........................ 315/169.1–169.4; 313/498, 495, 503; 345/72, 76, 77, 78, 55, 60, 63, 67, 211

(56) References Cited

U.S. PATENT DOCUMENTS

| | | | | |
|---|---|---|---|---|
| 5,990,629 A | * | 11/1999 | Ymada et al. ............ | 315/169.3 |
| 6,088,009 A | * | 7/2000 | Moon ....................... | 315/169.4 |
| 6,147,451 A | * | 11/2000 | Shibata et al. ........... | 315/169.3 |
| 6,150,766 A | * | 11/2000 | Shino et al. .............. | 315/169.4 |

* cited by examiner

Primary Examiner—Don Wong
Assistant Examiner—Wilson Lee
(74) Attorney, Agent, or Firm—Cantor Colburn LLP

(57) ABSTRACT

In a passive type EL display apparatus having a matrix structure, column electrodes include first column electrodes (211) corresponding to pixels at odd rows and second column electrodes (212) corresponding to pixels at even rows. The first and second column electrodes are individually driven by respective first and second column drivers (22, 23), while a row driver (21) drives pixels located at odd and even rows adjoining in the column direction, namely row electrodes corresponding to these pixels simultaneously, to thereby execute simultaneous display for one set of odd and even rows. An resulting EL display apparatus can provide reliable display with a small scale circuit without using frame buffers for temporarily storing data to be displayed.

15 Claims, 6 Drawing Sheets

ELECTROLUMINESCENCE DISPLAY APPARATUS

BACKGROUND OF THE INVENTION

1. Field of the Invention

The present invention relates to a passive type electroluminescence (EL) display apparatus in which anodes and cathodes, each pair of which having an emissive layer therebetween, are arranged in a matrix.

2. Description of Related Art

Organic EL devices are ideal for thin display configurations as they emit light and can eliminate need for a backlight as required in liquid crystal displays, and because they have unlimited viewing angle. Thus, wide application of organic EL devices is expected in the next generation of display devices.

As shown in an example in FIG. 1, an organic EL device (hereinafter referred to as an "OEL device") 1 can be constituted by forming an anode 3 comprising a transparent electrode made of ITO (Indium Tin Oxide) or the like on a transparent glass substrate 2, and forming, between the anode 3 and a cathode 4 comprising an MgIn alloy, a hole-transport layer 5 comprising MTDATA (4,4',4"-tris(3-methylphenylphenylamino)tryphenylamine), an emissive layer 6 comprising TPD (N,N'-diphenyl-N,N'-di(3-methylphenyl)-1,1'-biphenyl-4,4'-diamine) and Rubrene, and an electron-transport layer 7 comprising Alq3 (quinolinol aluminum complex) which are accumulated in this order. Holes injected from the anode 3 and electrons injected from the cathode 4 are recombined within the emissive layer 6 to emit light, which is radiated outward from the transparent anode side in the direction shown in the figure.

Display apparatuses employing thus configured OEL devices for each of a plurality of pixels disposed in a matrix and driving each OEL device for each pixel can be divided into two types according to their structure for driving each OEL device: passive type, and active type using TFTs. The circuit structure of the passive type is schematically shown in FIG. 2.

As shown in FIG. 2, individual matrices 8 and 9 are provided for the upper half and the lower half of a display screen, respectively. In the matrices 8 and 9, of the pair of electrodes in the aforementioned EL devices, the anodes 3 are column electrodes while the cathodes 4 are row electrodes. Each row electrode 4 is formed to intersect with all the column electrodes in each matrix. The column electrodes 3u in the matrix 8 extend in the column direction in the upper half of the screen (display area) so as to serve as common electrode lines for each pixel in the column direction, while the column electrodes 3d in the matrix 9 extend in the column direction in the lower half of the screen so as to serve as common electrode lines for each pixel in the column direction.

For the matrices 8 and 9, first and second column drivers 10, 11 for supplying column driving signals and first and second row drivers 12, 13 for supplying row driving signals as scan signals, are provided.

Of the scan signals supplied from the first and second row drivers 12 and 13, the scan signal of only the selected row of a plurality of rows becomes a low level for two horizontal scan periods (2H) while the scan signals for the other rows become a high level. Meanwhile, the first and second column drivers 10 and 11, to which gray-scale data mDATA for expressing the display gray scale of each pixel are input, output pulse signals having pulse widths proportional to this gray-scale data as column driving signals. The column driving signals are at a high level during the pulse width period, and thus, the EL device of the row that inputs the low level scan signal emits light.

Typically, the gray-scale data are temporarily stored in frame memories 14, 15 each having a capacity corresponding to one screen (one frame), and data stored in the upper half in one frame memory are sequentially supplied, line by line, into the first column driver 10, whereas the data in the lower half are sequentially supplied, line by line, into the second column driver 11. The first and second row drivers 12 and 13 scan each line at the same time in a sequence from top to bottom, so that display is achieved simultaneously in both of the divided halves of the screen.

If only one frame memory is provided, there is a possibility that the lower half of the screen displays data from the previous frame while the upper half displays data from a new frame which is already rewritten, resulting in different frame displays between the upper and lower screens. In order to avoid such a disadvantage, the two frame memories 14 and 15 are provided. Namely, while data are being read from one frame memory, data corresponding to the next frame is written into the other frame memory, and alternate repetition of this process will enable normal display.

The conventional passive type EL display apparatus which drives the devices in the divided manner as described above requires, as essential elements, frame memories for temporarily storing data in order to achieve normal display, and this enlarges the circuit scale entailing a cost increase in spite of the simple structure of the display section.

SUMMARY OF THE INVENTION

The present invention was made to solve the aforementioned problem of the related art, and aims to provide a light emitting display apparatus, for example an organic electroluminescence display apparatus such as an EL apparatus, capable of executing normal display without increasing the circuit scale.

In accordance with one aspect of the present invention, there is provided a light emitting display apparatus comprising display pixels that emit light arranged in a matrix, wherein each display pixel includes an emissive layer between first and second electrodes, said first electrodes being constituted by a column electrode extending in a column direction and said second electrodes being constituted by a row electrode extending in a row direction, each display pixel is formed at a point where said column electrode and said row electrode intersect, and said column electrode includes a first column electrode corresponding to display pixels at odd rows of display pixels associated as one column and a second column electrode corresponding to display pixels at even rows of said display pixels associated as the same one column. Said first and second column electrodes are driven independently, and display pixels at adjacent odd and even rows are simultaneously driven by row electrodes which are individually corresponded thereto.

In accordance with another aspect of the present invention, there is provided an electroluminescence display apparatus, wherein an emissive layer is disposed between an anode and a cathode, said anode being designated for a column electrode and said cathode being designated for a row electrode, said column electrode and said row electrode being arranged so as to intersect with each other, and wherein each display pixel is formed at a point where said column electrode and said row electrode intersect, said column electrode is divided into a first column electrode corresponding to display pixels at odd rows and a second column electrode corresponding to display pixels at even rows, said first and second column electrodes are individually driven by respective first and second column driver circuits, and said row electrode is driven by a row driver circuit, such that row electrodes at an odd row and at an even row which are adjacent in the column direction are driven simultaneously.

In accordance with another aspect of the present invention, in an apparatus as described above, during alternating first and second periods, said first column driver circuit receives data to be displayed on the display pixels at odd rows during a first period and said second column driver circuit receives data to be displayed on the display pixels at even rows during a second period, and said first and second column driver circuits and said row driver circuit output signals for driving the corresponding display pixels during a period corresponding to said first and second periods or during the first and second periods following said first and second periods when said data are received.

As described above, by simultaneously driving the adjacent display pixels at odd and even rows, within the column driver circuits, display data can be supplied in a line by line sequence to each display pixel in the display region more reliably than in the apparatus having frame memories corresponding to two screens, in which display data of one frame memory are displayed in the display region in a divided drive manner for the upper and lower section of the screen. Thus, the display data can be supplied in sequence to each display pixel of the display region without using a frame memory. Therefore, the circuit scale for the passive type emissive display apparatus is decreased to thereby reduce apparatus cost.

In accordance with still another aspect of the present invention, there is provided a light emitting display apparatus comprising display pixels that emit light arranged in a matrix, wherein each display pixel includes an emissive layer between first and second electrodes, said first electrodes being constituted by a column electrode extending in a column direction and said second electrodes being constituted by a row electrode extending in a row direction, each display pixel is formed at a point where said column electrode and said row electrode intersect, said column electrode includes a first column electrode corresponding to display pixels at odd rows of display pixels associated as one column and a second column electrode corresponding to display pixels at even rows of said display pixels associated as the same column, said first and second column electrodes being driven independently, said row electrode functions as a common row electrode for the display pixels at odd and even rows which are adjacent in the column direction, such that the common row electrode simultaneously drives said display pixels at adjacent odd and even rows.

In accordance with another aspect of the present invention, there is provided an electroluminescence display apparatus, wherein an emissive layer is disposed between an anode and a cathode, said anode being designated for a column electrode and said cathode being designated for a row electrode, said column electrode and said row electrode being arranged so as to intersect with each other, each display pixel is formed at a point where said column electrode and said row electrode intersect, said column electrode is divided into a first column electrode corresponding to display pixels at odd rows and a second column electrode corresponding to display pixels at even rows, said first and second column electrodes are individually driven by respective first and second column driver circuits, and said row electrode functions as a common row electrode for the display pixels at adjacent odd and even rows in the column direction, said common row electrode being driven by a row driver circuit to simultaneously drive the display pixels at odd and even rows.

In accordance with another aspect of the present invention, in an apparatus as described above, during alternating first and second periods, said first column driver circuit receives data to be displayed on display pixels at odd rows during a first period and said second column driver circuit receives data to be displayed on display pixels at even rows during a second period, and said first and second column driver circuits and said row driver circuit output signals for driving the corresponding display pixels during a period corresponding to said first and second periods or during the first and second periods following said first and second periods when said data are received.

The display pixels at odd and even rows which are adjacent in the column direction are driven by the same common row electrode, such that the number of outputs in the row driver circuit for driving the row electrodes is halved compared to that when the row electrodes are formed for each row, to thereby reduce the scale of said row driver circuit. Thus, elimination of the frame memory along with the reduction in the circuit scale of the row driver circuit results in a lower cost of the driver circuit while maintaining high display quality of the display apparatus.

In accordance with still another aspect of the present invention, there is provided a light emitting display apparatus having display pixels, each including an emissive layer between first and second electrodes, arranged in a matrix, comprising row electrodes extending in a row direction to form a striped pattern; and column electrodes extending in a column direction to form a striped pattern, wherein each of said display pixels is formed at a point where a row electrode and a column electrode intersect such that these electrodes respectively constitute said first and second electrodes, said column electrodes are constituted by comb-shaped first column electrodes whose teeth form said first and second electrodes of the display pixels at odd rows and comb-shaped second column electrodes whose teeth form said first and second electrodes of the display pixels at even rows which associated with the same column as said display pixels at odd rows, and the display pixels at adjacent odd and even rows in the column direction are driven simultaneously.

In accordance with still another aspect of the present invention, in an apparatus described above, two of said row electrode for respectively supplying row signals to said display pixels at adjacent odd and even rows are driven simultaneously.

In accordance with yet still another aspect of the present invention, in an apparatus described above, the display pixels at adjacent odd and even rows are driven simultaneously by a common row electrode for said display pixels.

By forming the first and second column electrodes in a comb shape as describe above, two of said column electrode for alternately driving the display pixels at odd and even rows associated as one column can be effectively disposed on a substrate. Further, in the display apparatus thus configured, the display data can be supplied to each display pixel in the display region in a line by line sequence within the column driver circuits more reliably than in the apparatus having frame memories corresponding to two screens, in which the display data of one frame memory are displayed in the display region in a divided drive manner for the upper and lower section of the screen, and a driving circuit having a small scale can be achieved.

Further, according to the present invention, in any of the above described apparatuses, the emissive layer may comprise an organic compound with light emitting function.

The emissive layer using such an organic compound is very advantageous in color display apparatuses or the like due to large variety of emissive colors and the wide range of materials.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENTS

Preferred embodiments of the present invention will be described in further detail with reference to the accompanying drawings.

Figure 3:
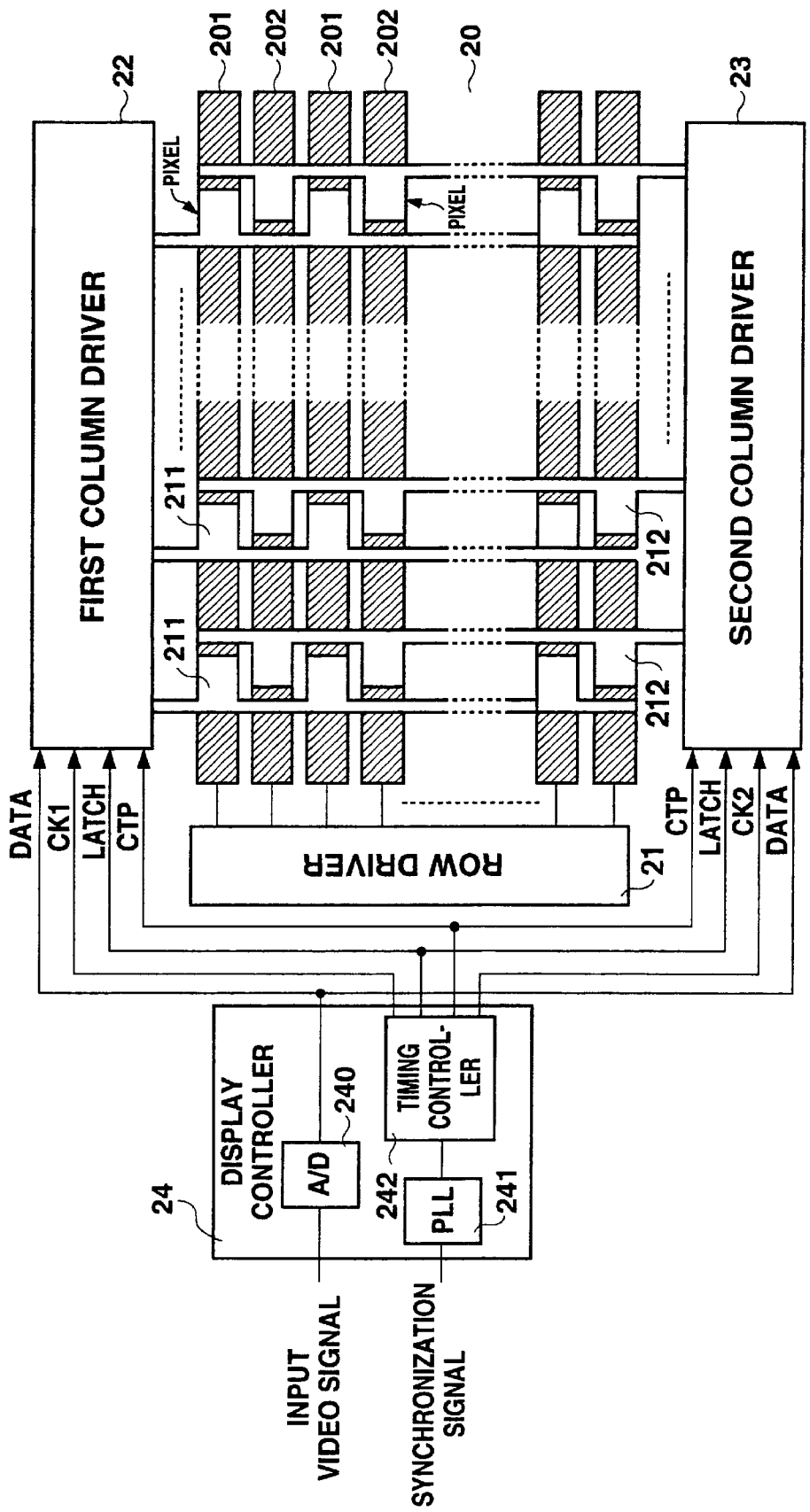
FIG. 3 is a conceptual view showing the structure of a passive type EL display apparatus according to the present invention.

Referring to FIG. 3, which is a block diagram showing one embodiment of the present invention, anodes of organic EL devices are formed by column electrodes 211, 212 while cathodes are formed by row electrodes 201, 202 such that they constitute a matrix configuration 20. The row electrodes 201, 202 are alternately provided for every line as in the previously described related art, and the electrodes 201 at odd rows as well as the electrodes 202 at even rows continuously extend so as to intersect with all the column electrodes.

Figure 1:
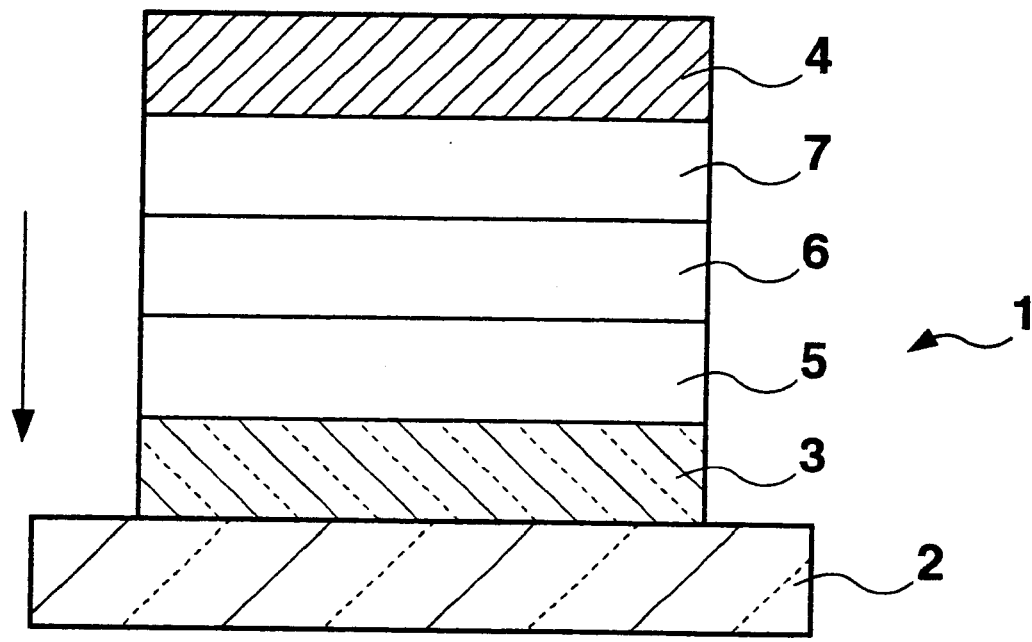
FIG. 1 is a sectional view showing the structure of an OEL display apparatus of a related art.
Figure 2:
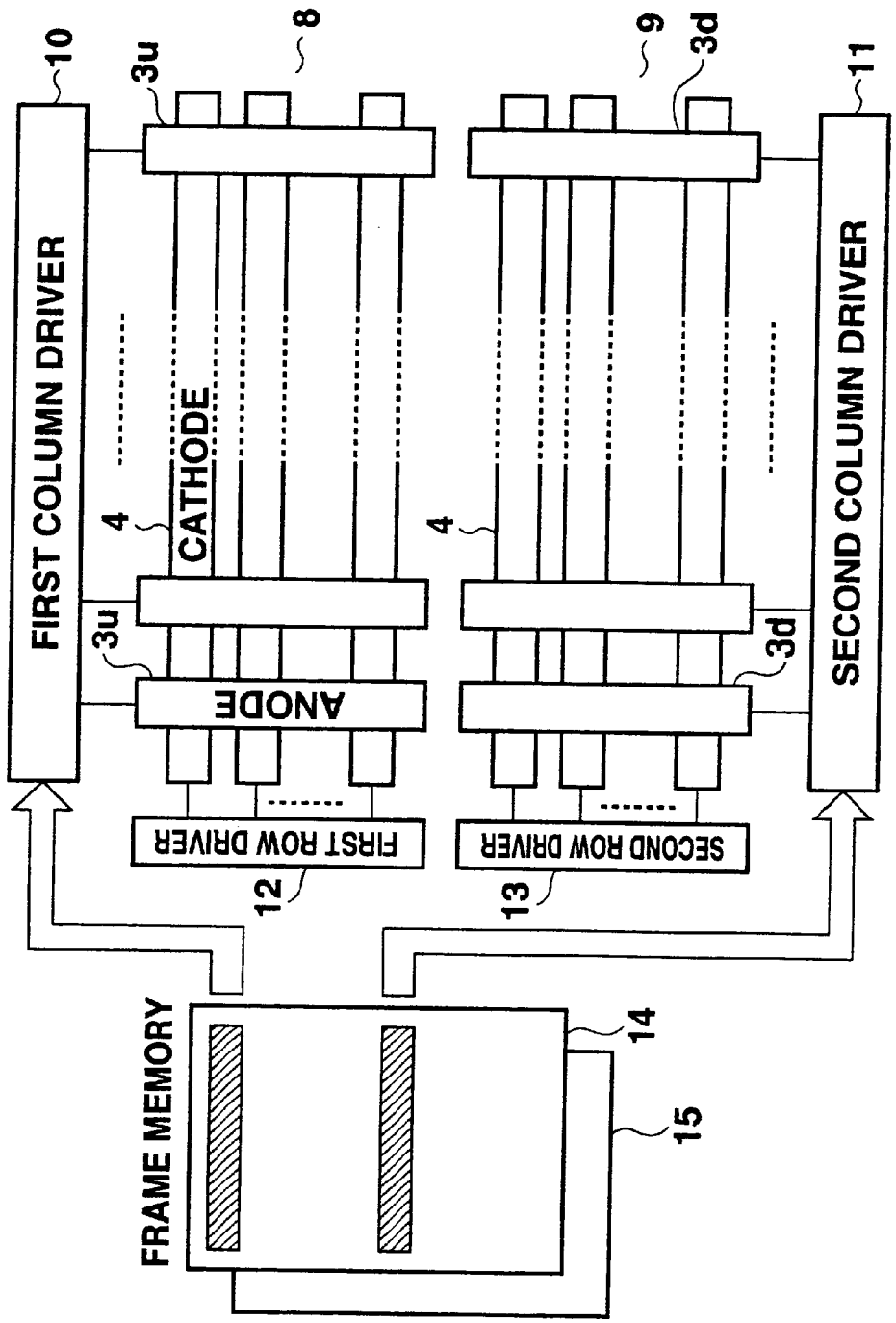
FIG. 2 is a conceptual view showing the structure of a passive type EL display apparatus according to a related art.

In the present invention, the column electrodes are not divided into upper and lower display areas as in the related art, but rather according to whether a display pixel including the column electrode which serves also as an anode of the organic EL device is located at an odd row or at an even row. Namely, each of the first column electrodes 211 has a substantially comb shape formed by connecting electrodes existing only at portions superposing respective row electrodes 201 at odd rows, whereas each of the second column electrodes 212 has a substantially comb shape formed by connecting electrodes existing only at portions superposing respective row electrodes 201 at even rows. In other words, the first and second column electrodes 211, 212 comprise electrodes corresponding to the comb teeth, each of which serves as an anode of each OEL for one display pixel, and the first and second column electrodes are arranged such that these teeth alternately engage at odd and even rows. Pixel portions, each being formed by a pair of the first and second column electrodes 211 and 212, are respectively extend in the column direction along a straight line, so that, at locations where the column electrodes intersect with the row electrodes, the display pixels each including an emissive element layer (at least an emissive layer) made of an organic compound as in FIG. 1 interposed therebetween, are disposed in the column direction along a straight line. Namely, the first and second column electrode pairs alternately function as the anodes of the display pixels at odd and even rows associated as the same column.

The row electrodes at odd rows 201 and at even rows 202 are respectively connected to a single row driver 21 for supplying scan signals as row driving signals. The first column electrodes 211 are connected to a first column driver 22 for supplying first column driving signals whereas the second column electrodes 212 are connected to a second column driver 23 for supplying second column driving signals. Both of the first and second column drivers 22 and 23 are connected to a display controller 24, which comprises an AD converter 240 for converting an input video signal into gray-scale data DATA representing the display gray scale of each pixel, a PLL circuit 241 for phase locking an input synchronization signal, and a timing controller 242 for generating various timing signals based on output signals from the PLL circuit 241.

Data DATA output from the AD converter 240, a latch pulse LATCH and a counter pulse CTP output from the timing controller 242 are input to the first and second column drivers 22 and 23 in common. Meanwhile, a first shift clock CK1 and a second shift clock CK2 output from the timing controller are input to the first and second column drivers 22 and 23, respectively.

The first and second column drivers 22 and 23 have the same structure. This structure is illustrated in FIG. 4.

Figure 4:
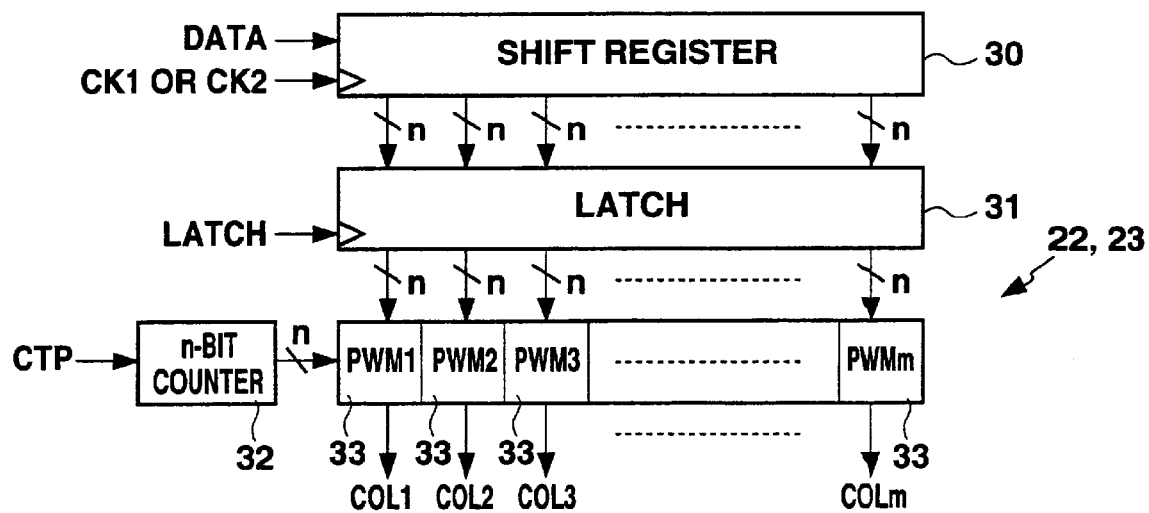
FIG. 4 is a structural view of a column driver circuit of the EL display apparatus according to the present invention.
Figure 5:
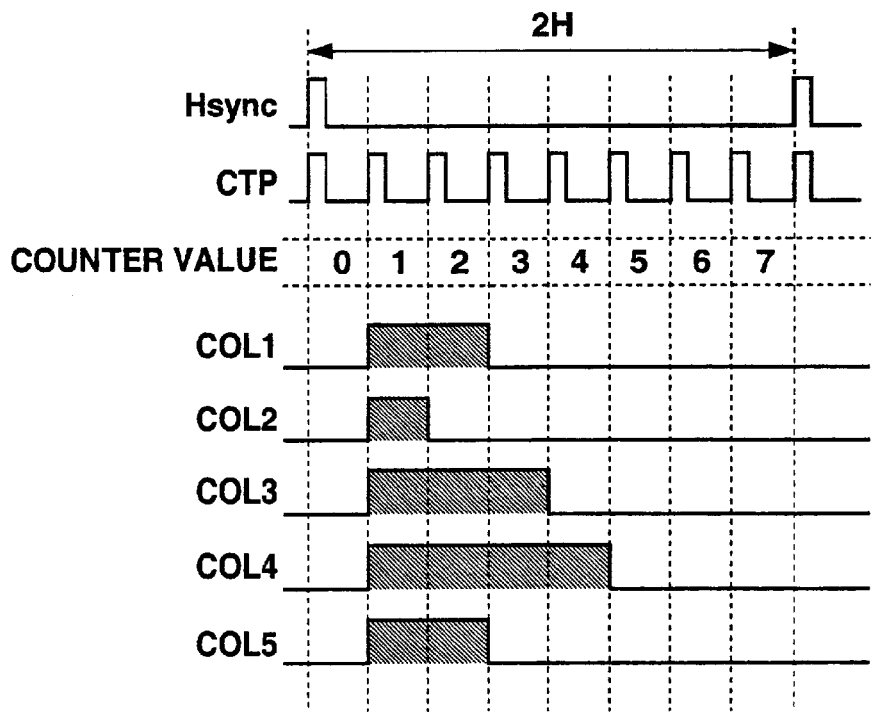
FIG. 5 is a timing chart showing a method for displaying the pulse width gray scale of the EL display apparatus according to the present invention.

Referring to FIG. 4, each column driver comprises a shift register 30 for inputting n-bit gray-scale data DATA for each column according to a shift clock CK1 or CK2, a latch circuit 31 for latching the data input by the shift register 30 according to a latch pulse LATCH, an n-bit counter 32 for counting counter pulse CTP to represent the gray scale level by the counter value, and m pulse width modulation circuits 33 provided for each column for comparing the n-bit gray scale data from the latch circuit 31 with the n-bit counter value to respectively output column driving signals COL1, COL2, COL3, . . . COLm of pulse widths according to the gray scale data, as shown in FIG. 5.

More specifically, the counter value of the n-bit counter 32, when n=3, for example, changes in a sequence of "0", "1", . . . "7" during two horizontal scan periods (2H). Output of all the column driving signals COL1, COL2, COL3, . . . COLm begins simultaneously when the counter value becomes "1", and each signal holds an H level during the pulse width period in accordance with the gray scale data of each pixel. Accordingly, pixels of the same row in the matrix 20 emit light during the pulse width periods shown in FIG. 5, and the gray scale of each pixel is expressed by this light emitting period.

Figure 6:
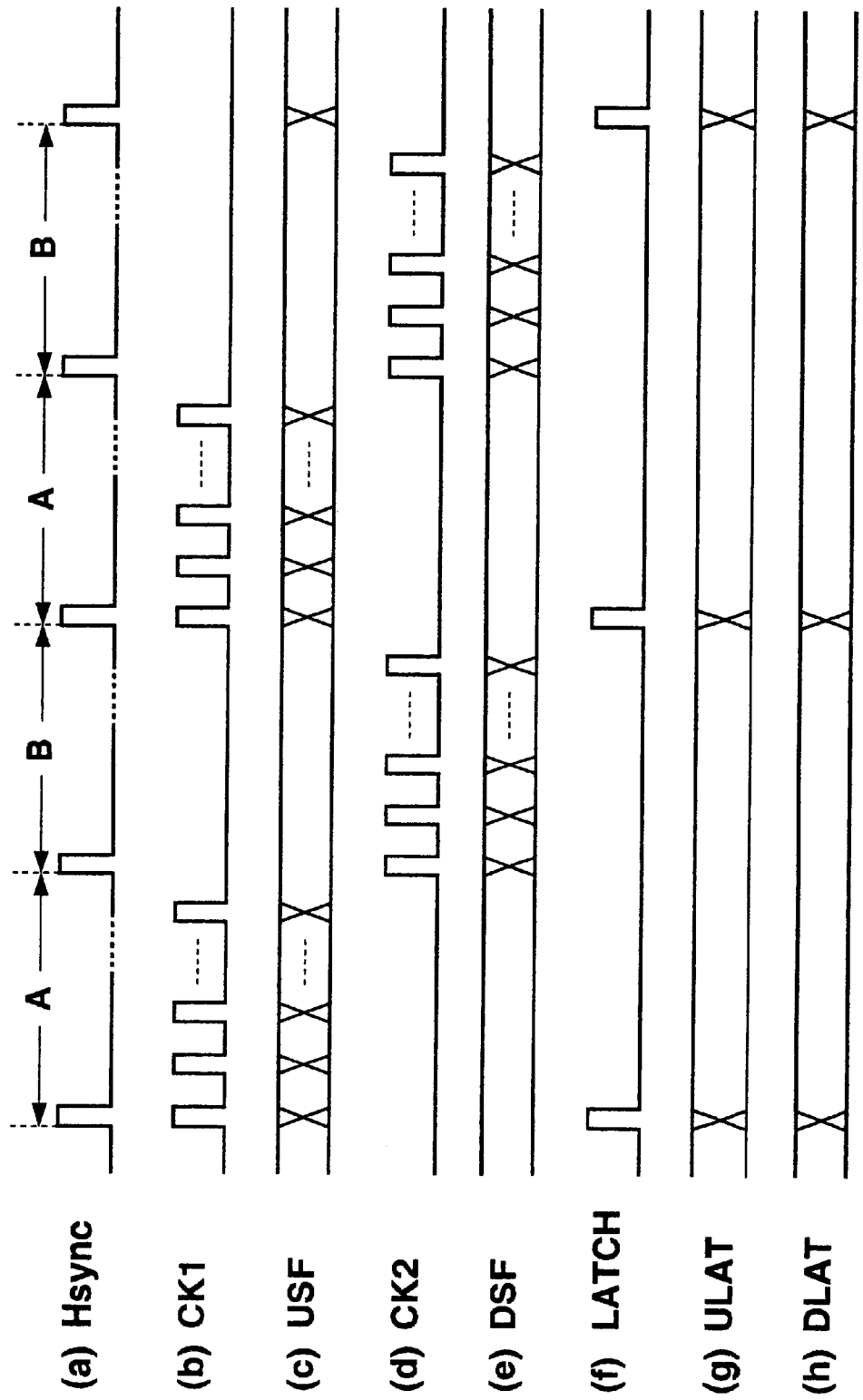
FIG. 6 is a timing chart for explaining the operation of the EL display apparatus according to the present invention.

The operation of the embodiment shown in FIG. 3 will be described referring to FIG. 6.

The first shift clock CK1 generates a clock only during A period in 1H and no clock is generated during the subsequent B period, as shown in FIG. 6(b). On the contrary, the second shift clock CK2 generates a clock only during B period in 1H and no clock is generated during the subsequent A period, as shown in FIG. 6(d). As described above, the first shift clock CK1 is input to the first column driver 22 while the second shift clock CK2 is input to the second column driver 23. Therefore, of the input data DATA, data of odd lines are sequentially supplied to the shift register 30 of the first column driver 22 during A periods whereas data of even lines are sequentially supplied to the shift register 30 of the second column driver 23 during B periods, and the contents of each shift register 30, USF and DSF are as shown in FIGS. 6(c) and (d), respectively. Because a latch pulse LATCH is output only at the beginning of A period as shown in FIG. 6(f), the contents USF, DSF of each shift register 30 are simultaneously latched by the respective latch circuit 31 in the first and second column driver 22 and 23.

As described above, a counter pulse CTP input to the n-bit counter 32 generates a predetermined number (which is 8 if n=3) of pulses during 2H as shown in FIG. 5, so that each of the pulse width modulation circuits 33 in the first and second column drivers 22 and 23 outputs, as a column driving signal, a pulse width modulation signal in accordance with the gray scale level during 2H including A and B periods. Namely, the first column driver 22 outputs column driving signals corresponding to odd rows, which are then supplied to the first column electrodes 211 in the matrix 20 whereas the second column driver 23 outputs column driving signals corresponding to even rows, which are then supplied to the second column electrodes 212 in the matrix 20. On the other hand, the row driver 21 simultaneously scans a pair of adjoining row electrodes 201 and 202 corresponding to odd and even rows, which is repeated in sequence from the upper to lower lines of the screen. Thus, EL light emission for display is achieved simultaneously in adjoining two row lines of odd and even rows in the matrix 20, in a sequence from the upper to lower lines.

According to this embodiment, adjoining row electrodes at odd and even rows are simultaneously driven, such that reliable display can be implemented without providing frame memories for storing the input data.

Figure 7:
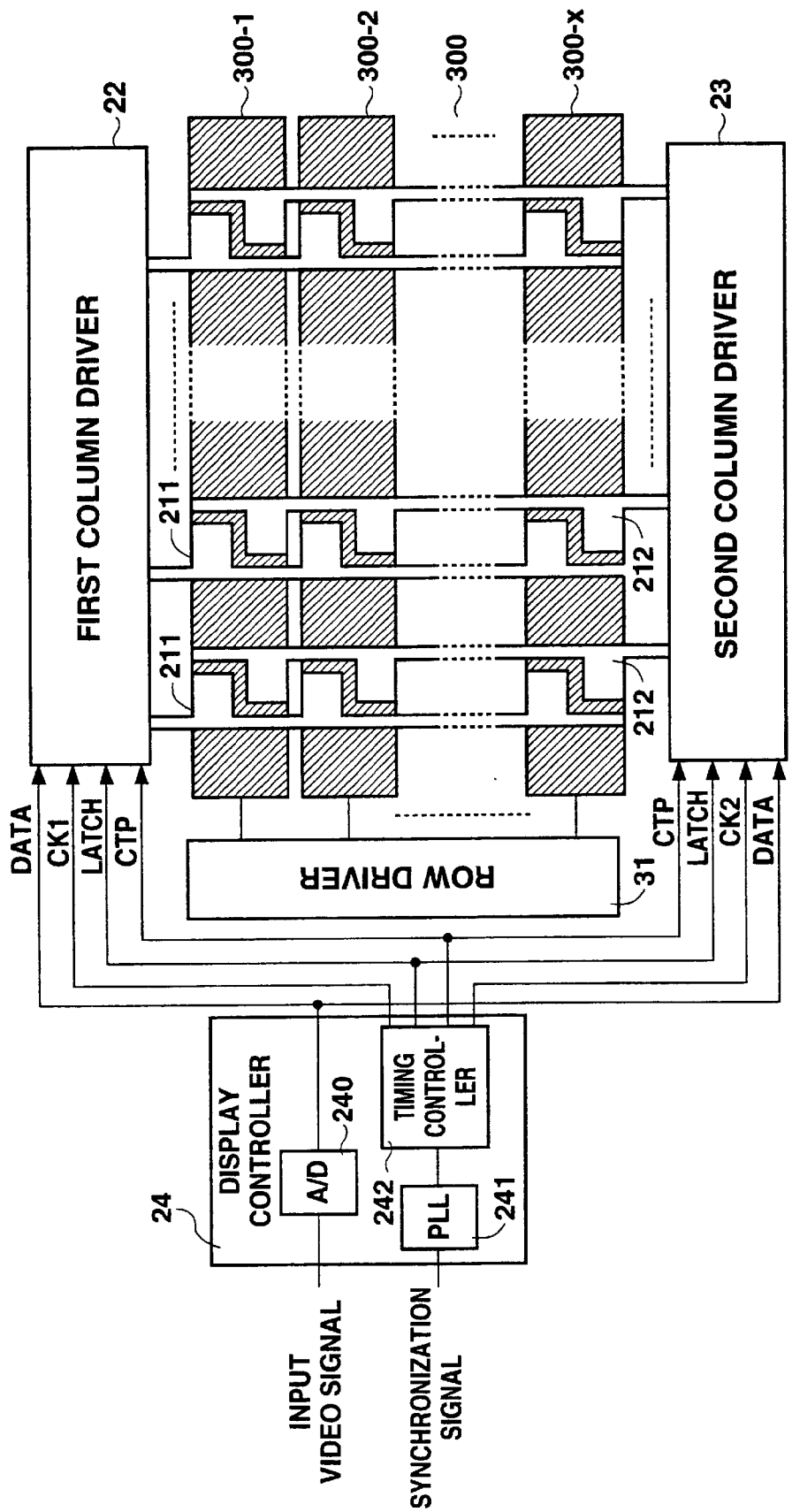
FIG. 7 is an example of the structure of another EL display apparatus according to the present invention.

A second embodiment of the present invention will be described with reference to FIG. 7.

The second embodiment differs from the first embodiment in the structure of row electrodes 300 (300-1, 300-2, ..., 300-x), and of a row driver 31.

More specifically, while in the first embodiment the row electrodes are provided for every line as shown in FIG. 3, in this second embodiment one row electrode (300-1, 300-2, ... 300-x) is provided for two row lines of adjoining odd and even rows. This embodiment in which the row electrodes are thus shared will otherwise operate in exactly the same manner as the first embodiment in which two lines of adjoining odd and even rows are driven simultaneously. However, by incorporating the configuration of the second embodiment, the circuit scale can be further reduced because the number of row electrodes to be driven by the row driver 31 is halved.

While the preferred embodiments of the present invention have been described using specific terms, such description is for illustrative purposes only, and it is to be understood that changes and variations may be made without departing from the spirit or scope of the appended claims.

What is claimed is:

1. A light emitting display apparatus comprising display pixels that emit light arranged in a matrix, wherein each display pixel includes an emissive layer between first and second electrodes, said first electrodes being constituted by a column electrode extending in a column direction and said second electrodes being constituted by a row electrode extending in a row direction, each display pixel is formed at a point where said column electrode and said row electrode intersect, and said column electrode includes a first column electrode corresponding to display pixels at odd rows of display pixels associated as one column and a second column electrode corresponding to display pixels at even rows of said display pixels associated as one column, said first and second column electrodes being driven independently, and display pixels at adjacent odd and even rows being simultaneously driven by said row electrodes which are individually corresponded thereto.

2. The apparatus according to claim 1 wherein said emissive layer comprises an organic compound with light emitting function.

3. A light emitting display apparatus comprising display pixels that emit light arranged in a matrix, wherein each display pixel includes an emissive layer between first and second electrodes, said first electrodes being constituted by a column electrode extending in a column direction and said second electrodes being constituted by a row electrode extending in a row direction, each display pixel is formed at a point where said column electrode and said row electrode intersect, said column electrode includes a first column electrode corresponding to display pixels at odd rows of display pixels associated as one column and a second column electrode corresponding to display pixels at even rows of said display pixels associated as one column, said first and second column electrodes being driven independently, and said row electrode functions as a common row electrode for display pixels at odd and even rows which are adjacent in the column direction such that the common row electrode simultaneously drives said display pixels at adjacent odd and even rows.

4. The apparatus according to claim 3 wherein said emissive layer comprises an organic compound with light emitting function.

5. An electroluminescence display apparatus, wherein an emissive layer is disposed between an anode and a cathode, said anode being designated for a column electrode and said cathode being designated for a row electrode, said column electrode and said row electrode being arranged so as to intersect with each other, each display pixel is formed at a point where said column electrode and said row electrode intersect, said column electrode is divided into a first column electrode corresponding to display pixels at odd rows and a second column electrode corresponding to display pixels at even rows, said first and second column electrodes are individually driven by respective first and second column driver circuits, and said row electrode is driven by a row driver circuit, such that row electrodes at odd and even rows which are adjacent in the column direction are driven simultaneously.

6. The apparatus according to claim 5, wherein during alternating first and second periods, said first column driver circuit receives data to be displayed on the display pixels at odd rows during a first period and said second column driver circuit receives data to be displayed on the display pixels at even rows during a second period, and said first and second column driver circuits and said row driver circuit output signals for driving the corresponding display pixels during a period corresponding to said first and second periods.

7. The apparatus according to claim 5 wherein said emissive layer comprises an organic compound with light emitting function.

8. The apparatus according to claim 5, wherein during alternating first and second periods, said first column driver circuit receives data to be displayed on the display pixels at odd rows during a first period and said second column driver circuit receives data to be displayed on the display pixels at even rows during a second period, and said first and second column driver circuits and said row driver circuit output signals for driving the corresponding display pixels during the first and second periods following said first and second periods when said data are received.

9. An electroluminescence display apparatus, wherein an emissive layer is disposed between an anode and a cathode, said anode being designated for a column electrode and said cathode being designated for a row electrode, said column electrode and said row electrode being arranged so as to intersect with each other, each display pixel is formed at a point where said column electrode and said row electrode intersect, said column electrode is divided into a first column electrode corresponding to display pixels at odd rows and a second column electrode corresponding to display pixels at even rows, said first and second column electrodes are individually driven by respective first and second column driver circuits, and said row electrode functions as a common row electrode for display pixels at adjacent odd and even rows in the column direction, said common row electrode being driven by a row driver circuit to simultaneously drive the display pixels at odd and even rows.

10. The apparatus according to claim 9, wherein during alternating first and second periods, said first column driver circuit receives data to be displayed on display pixels at odd rows during a first period and said second column driver circuit receives data to be displayed on display pixels at even rows during a second period, and said first and second column driver circuits and said row driver circuit output signals for driving the corresponding display pixels during a period corresponding to said first and second periods.

11. The apparatus according to claim 9 wherein said emissive layer comprises an organic compound with light emitting function.

12. The apparatus according to claim 9, wherein during alternating first and second periods, said first column driver circuit receives data to be displayed on display pixels at odd rows during a first period and said second column driver circuit receives data to be displayed on display pixels at even rows during a second period, and said first and second column driver circuits and said row driver circuit output signals for driving the corresponding display pixels during the first and second periods following said first and second periods when said data are received.

13. A light emitting display apparatus having display pixels, each including an emissive layer between first and second electrodes, arranged in a matrix, comprising:

row electrodes extending in a row direction to form a striped pattern; and column electrodes extending in a column direction to form a striped pattern, wherein each of said display pixels is formed at a point where a row electrode and a column electrode intersect such that these electrodes respectively constitute said first and second electrodes, said column electrodes are constituted by comb-shaped first column electrodes whose teeth function as said first electrodes of the display pixels at odd rows and comb-shaped second column electrodes whose teeth function as said second electrodes of the display pixels at even rows associated with the same column as said display pixels at the odd rows, and the display pixels at odd and even rows adjacent in the column direction are driven simultaneously.

14. The apparatus according to claim 13, wherein two of said row electrode for respectively supplying row signals to said display pixels at adjacent odd and even rows are driven simultaneously.

15. The apparatus according to claim 13, wherein the display pixels at adjacent odd and even rows are driven simultaneously by a common row electrode for said display pixels.

* * * * *